United States Patent
Sotta et al.

(10) Patent No.: US 11,295,950 B2
(45) Date of Patent: Apr. 5, 2022

(54) STRUCTURE COMPRISING SINGLE-CRYSTAL SEMICONDUCTOR ISLANDS AND PROCESS FOR MAKING SUCH A STRUCTURE

(71) Applicant: Soitec, Bernin (FR)

(72) Inventors: David Sotta, Grenoble (FR); Jean-Marc Bethoux, La Buisse (FR); Oleg Kononchuk, Theys (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 16/337,206

(22) PCT Filed: Sep. 21, 2017

(86) PCT No.: PCT/FR2017/052529
§ 371 (c)(1),
(2) Date: Mar. 27, 2019

(87) PCT Pub. No.: WO2018/060570
PCT Pub. Date: Apr. 5, 2018

(65) Prior Publication Data
US 2019/0228967 A1 Jul. 25, 2019

(30) Foreign Application Priority Data
Sep. 29, 2016 (FR) .................................. 1659343

(51) Int. Cl.
*H01L 21/02* (2006.01)
(52) U.S. Cl.
CPC .... *H01L 21/02645* (2013.01); *H01L 21/0242* (2013.01); *H01L 21/0254* (2013.01);
(Continued)
(58) Field of Classification Search
CPC ......... H01L 21/02645; H01L 21/02381; H01L 21/0242; H01L 21/02488; H01L 21/02538
See application file for complete search history.

(56) References Cited

U.S. PATENT DOCUMENTS

| 6,171,936 B1* | 1/2001 | Fitzgerald | H01L 21/02381 438/503 |
| 8,124,470 B1* | 2/2012 | Bedell | H01L 29/66772 438/216 |

(Continued)

FOREIGN PATENT DOCUMENTS

| EP | 2151856 A1 | 2/2010 |
| EP | 2151852 B1 | 1/2020 |

(Continued)

OTHER PUBLICATIONS

Doll et al. "Aluminum nitride on titanium for CMOS compatible piezoelectric transducer," J Micromech. Microeng. 20010 20(2) (Year: 2010).*

(Continued)

*Primary Examiner* — Matthew L Reames
(74) *Attorney, Agent, or Firm* — TraskBritt

(57) ABSTRACT

A structure that can be used to manufacture at least one active layer made of a III-V material thereon includes a substrate comprising a carrier having a main face, a dielectric layer located on the main face of the carrier, and a plurality of single-crystal semiconductor islands located directly on the dielectric layer. The islands have an upper surface in order to serve as a seed surface for the growth of the active layer. The structure further comprises a seed layer located between the single-crystal semiconductor islands, directly on the portion of the dielectric layer that is not covered by the islands, without masking the upper surface of the islands, so that the dielectric layer is not exposed to the external environment.

20 Claims, 2 Drawing Sheets

(52) U.S. Cl.
CPC .. *H01L 21/02381* (2013.01); *H01L 21/02488* (2013.01); *H01L 21/02532* (2013.01); *H01L 21/02538* (2013.01); *H01L 21/02639* (2013.01)

(56) References Cited

U.S. PATENT DOCUMENTS

| | | | |
|---|---|---|---|
| 2002/0094649 A1* | 7/2002 | Arthanari | H01L 21/76229 438/296 |
| 2003/0145783 A1 | 8/2003 | Motoki et al. | |
| 2004/0029365 A1 | 2/2004 | Linthicum et al. | |
| 2007/0054467 A1* | 3/2007 | Currie | H01L 27/1203 438/458 |
| 2007/0217460 A1 | 9/2007 | Ishibashi et al. | |
| 2012/0108019 A1 | 5/2012 | Harmann | |
| 2012/0119218 A1 | 5/2012 | Su | |
| 2015/0155331 A1* | 6/2015 | Guenard | H01L 31/075 257/93 |
| 2016/0111593 A1 | 4/2016 | Dechoux et al. | |
| 2016/0111618 A1* | 4/2016 | Shur | H01L 33/641 257/94 |
| 2016/0141451 A1 | 5/2016 | Amstatt et al. | |

FOREIGN PATENT DOCUMENTS

| | | |
|---|---|---|
| JP | 2002-009004 A | 1/2002 |
| JP | 2003-183100 A | 7/2003 |
| JP | 2010-278313 A | 12/2010 |
| JP | 2012-507864 A | 3/2012 |
| JP | 2016-529731 A | 9/2016 |

OTHER PUBLICATIONS

Pan et al. "Enhanced thermal conductivity of polycrstalline aluminum nitride thin films by optimizing the interface structure," J. Appl. Phys. 112, 044905 (2012); https://doi.org/10.1063/1.4748048 (Year: 2012).*

Electronics Coolings Editors, "The thermal conductivity of silicon," https://www.electronics-cooling.com/1998/05/the-thermal-conductivity-of-silicon/ 1998 (Year: 1998).*

International Search Report for International Application No. PCT/FR2017/052529 dated Jan. 15, 2018, 3 pages.

International Written Opinion for International Application No. PCT/FR2017/052529 dated Jan. 15, 2018, 5 pages.

Yin et al., Buckling Suppression of SiGe Islands on Compliant Substrates, Journal of Applied Physics, vol. 94, No. 10, (Nov. 15, 2003), pp. 6875-6882.

French Search report for French Application No. 1659343, dated Jul. 1, 2017, 2 pages.

Japanese Notice of Rejection from Japanese Application No. 2019-517074, dated Aug. 17, 2021, 6 pages.

Taiwanese Opinion and Search Report for Taiwan Application No. 11020899510 dated Sep. 14, 2021, 14 pages with translation.

European Communication pursuant to Intent to Grant for European Application No. 17783928, dated May 7, 2020, 5 pages with translation.

European Communication pursuant to Rule 71(3) EPC for European Application No. 17783928, dated May 7, 2020, 12 pages with translation.

French Written Opinion for French Application No. 1659343, dated Jul. 1, 2017, 4 pages with translation.

Wang et al., "Technical Note; Freestanding GaN slab fabricated on patterned silicon on an insulator substrate", Journal of Micromechanics & Microengineering, Institute of Physics Publishing, Bristol, GB, vol. 20, No. 2, Feb. 1, 2020, 5 pages.

Taiwanese Office Action for Application No. 106132494 dated Mar. 11, 2021, 12 pages with translation.

Korean Notice of Preliminary Rejection for Korean Application No. 10-2019-7008213 dated Oct. 18, 2021, 4 pages.

* cited by examiner

STRUCTURE COMPRISING SINGLE-CRYSTAL SEMICONDUCTOR ISLANDS AND PROCESS FOR MAKING SUCH A STRUCTURE

CROSS-REFERENCE TO RELATED APPLICATIONS

This application is a national phase entry under 35 U.S.C. § 371 of International Patent Application PCT/FR2017/052529, filed Sep. 21, 2017, which published as International Patent Publication WO 2018/060570 A1 on Apr. 5, 2018, which claims the benefit under Article 8 of the Patent Cooperation Treaty to French Patent Application Serial No. 1659343, filed Sep. 29, 2016.

TECHNICAL FIELD

This disclosure relates to a structure comprising single-crystal semiconductor islands located on a carrier. The structure is intended to receive an active layer of a III-V material or a stack of such active layers, constituting a semiconductor device, such as a light-emitting diode.

BACKGROUND

The documents "Buckling suppression of SiGe islands on compliant substrates," Yin et al. (2003), *Journal of Applied Physics*, 94(10), 6875-6882, EP2151852 and EP2151856 disclose different methods for making a substrate formed by a carrier having a main face, a dielectric layer on the main face of the carrier, and a plurality of single-crystal semiconductor islands on the dielectric layer.

As explained in these documents, the single-crystal semiconductor islands are formed in a continuous film of materials to release the stress originally present in this film by deformation during a relaxation treatment. In this way, relaxed or partially relaxed islands are formed without excessive deformation by buckling, provided that the islands have sufficiently small dimensions.

The formation of the islands and the relaxation treatment can be performed while the continuous film is located on the dielectric layer and the substrate carrier. Alternatively, the formation of the islands and the relaxation treatment can be performed while the continuous film resides on an intermediate carrier, from which the relaxed or partially relaxed islands will be transferred to the dielectric layer covering the carrier and thus form the substrate.

The islands are advantageously made of germanium, SiGe, a III-N material of the general formula InAlGaN or any other material that does not commonly exist in massive form.

Regardless of the method used to make the substrate, the islands can be intended to receive an active layer of III-V materials, or a stack of such semiconductor and crystalline layers, constituting a semiconductor device. These can be, for example, single-crystal active layers constituting the quantum wells of a light-emitting diode, or the photogenerator layers of a photovoltaic cell. Reference can be made to document US2015155331.

The development of functional and efficient semiconductor devices requires very precise control of the nature and thickness of the active layers that constitute them. These can typically have thicknesses ranging from a few nm to a few hundred nm.

To this end, the parameters of the growth equipment (such as uniformity of precursor flows, temperature and partial pressure in the deposition chamber) affecting the constitution and uniformity of the active layers are controlled with great precision.

Despite all the care taken to control these parameters, the applicant observed that an active layer of a III-V material formed on the islands of an "island" substrate could have a non-uniform thickness, greater on the edges of the islands than in the centers thereof. This is particularly true when an active layer of InGaN grows on relaxed or partially relaxed InGaN islands. This oversized peripheral area cannot be exploited, which limits the useful surface area of the islands.

It should be noted that the dimensions of the islands cannot always be freely chosen to compensate for this unusable peripheral area. Indeed, these dimensions can be imposed to enable the relaxation of the islands without excessive buckling. The useful surface area of the island is, therefore, necessarily limited, which does not enable the formation of large semiconductor components and limits the interest of these substrates.

BRIEF SUMMARY

Embodiments of the present disclosure are intended to compensate for all or part of the above-mentioned disadvantages. In particular, the present disclosure aims to provide an "island" substrate for the development of at least one active layer having a uniform thickness.

The present disclosure proposes a structure for the preparation of at least one active layer of a III-V material comprising a substrate formed by a carrier having a main face, a dielectric layer located on the main face of the carrier, and a plurality of single-crystal semiconductor islands located directly on the dielectric layer, the islands having an upper surface to be used as a seed for the growth of the active layer. According to the disclosure, the structure comprises a seed layer located between the single-crystal semiconductor islands, directly on the portion of the dielectric layer that is not covered by the islands, without masking the upper surface of the islands, so that the dielectric layer is no longer exposed to its environment.

The structure according to the disclosure is intended to receive, by growth, at least one active layer. After conducting extensive experiments, the applicant observed that some species constituting the active layer, particularly when it was made of a III-V material, could lack chemical affinity with the dielectric of the dielectric layer and could, therefore, not be fixed thereto. These species are then likely to migrate, during the growth of the active layer, to be fixed to the edges of the islands, which disrupts the thickness uniformity of the active layer that forms on the islands.

By providing the structure with a seed layer directly on the dielectric layer between the semiconductor islands, the structure of the disclosure makes it possible to prevent this phenomenon and forms a particularly uniform active layer.

According to other advantageous and unrestrictive characteristics of the disclosure, taken alone or in any technically feasible combination:
- the carrier is made of silicon or sapphire;
- the dielectric layer comprises silicon oxide and/or silicon nitride;
- the single-crystal semiconductor islands comprise a III-V material, and more particularly a III-N material;
- the single-crystal semiconductor islands are made of or include InGaN;
- the seed layer is made of polycrystalline AlN.

The disclosure also proposes a method for making a structure, the method comprising providing a substrate comprising a carrier having a main face, a dielectric layer located over the entire main face of the carrier, and a plurality of single-crystal semiconductor islands located directly on the dielectric layer, the islands having an upper surface to be used as a seed for the growth of an active layer of a III-V material. According to the disclosure, the method involves forming a seed layer on the portion of the dielectric layer that is not covered by the islands, without masking the upper surface of the islands, so that the dielectric layer is no longer exposed to its environment.

According to other advantageous and unrestrictive characteristics of the disclosure, taken alone or in any technically feasible combination:

- the formation of the seed layer comprises depositing the seed layer on and between the single-crystal semiconductor islands, and then selectively removing the portion of the seed layer located on the crystalline semiconductor islands;
- the selective removal of the portion of the seed layer located on the single-crystal semiconductor islands is carried out by mechanical-chemical polishing;
- the formation of the seed layer comprises the selective formation of a protective layer on the single-crystal semiconductor islands, the deposition of the seed layer on the protective layer and on the exposed surface of the dielectric layer between the single-crystal semiconductor islands, and the selective removal of the protective layer and the portion of the seed layer located on the single-crystal semiconductor islands;
- the protective layer comprises a photosensitive resin and the selective formation of the protective layer comprises a photolithography step;
- the selective removal of the protective layer and the seed layer located on the protective layer is carried out by chemical etching.

The disclosure also relates to a method for making a semiconductor device comprising providing a structure according to the disclosure and forming at least one active layer of a III-V material on the single-crystal semiconductor islands.

BRIEF DESCRIPTION OF THE DRAWINGS

Other characteristics and advantages of the disclosure will emerge from the detailed description of the disclosure that follows with reference to the appended figures on which.

DETAILED DESCRIPTION

Figure 1A:
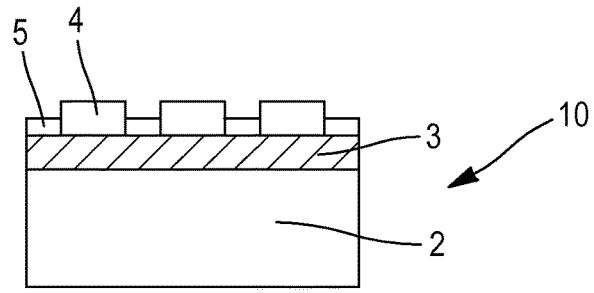
FIGS. 1a and 1b schematically show a cross-sectional and top view of a structure according to the disclosure.
Figure 1B:
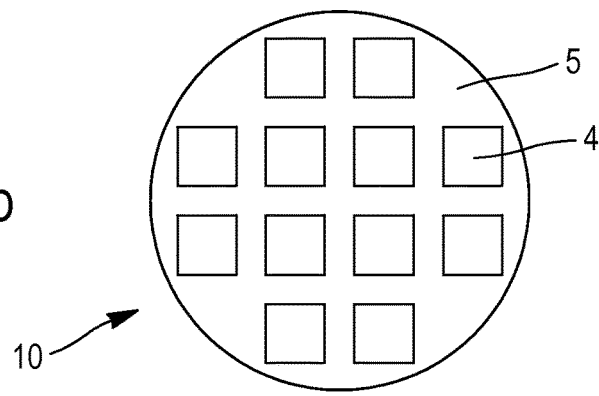

FIGS. 1a and 1b schematically show a cross-sectional and top view of a structure 10 according to the disclosure. The structure 10 can be shaped like a standard size circular wafer, for example, 2 inches (50 mm), 4 inches (100 mm) or even 200 mm in diameter. But the disclosure is by no means limited to these dimensions or shapes.

The structure 10 includes a carrier 2, for example, made of silicon or sapphire. The carrier 2 has a main face. A dielectric layer 3 is located on the main surface of the carrier 2. The dielectric layer 3 can be made of silicon dioxide, silicon nitride, or a single or multiple stack(s) of layers made of, for example, these materials. The dielectric layer 3 can have a thickness between 10 nm and several microns.

The structure 10 also includes, directly on the dielectric layer 3, a plurality of single-crystal semiconductor islands 4 (more simply referred to as "islands" in the following description). A "plurality of islands" refers to a film formed by a set of independent and non-jointed areas, which can be delimited by trenches exposing the dielectric layer 3 as shown in FIG. 1b. All the islands may have the same or different sizes and/or shapes.

The disclosure is by no means limited to the islands 4 of a particular nature, but the structure 10 finds a particularly interesting application when these islands are made of a relaxed or partially relaxed III-V material, in particular, InGaN. The InGaN material can have an indium content between 1% and 10%. Each island can have a thickness between 100 nm and 200 nm, and a main dimension (diameter or length depending on the shape of the island) between a few microns and 1 mm. The islands 4 can be separated from each other by trenches the width of which can be between 1 and 50 microns, and which expose the dielectric layer to its environment.

A structure 10 can thus be formed with the islands 4, the exposed surfaces of which have a lattice parameter between 0.3189 nm and 0.3210 nm, capable of receiving at least one active layer of a III-V material to form a semiconductor device such as a light-emitting diode.

It could also be decided to make, depending on the nature of the semiconductor device being made, the plurality of islands of AlGaN, or of any other material, such as a III-V material, and more particularly a III-N material.

According to the disclosure, the structure 10 also includes a seed layer 5 between the islands 4, directly on the dielectric layer 3. This seed layer 5 is located directly on the portion of the dielectric layer 3 that is not covered by the islands 4, so that this dielectric layer 3 is no longer directly exposed to its environment. The seed layer 5 does not mask the upper surface of the islands 4 so that these surfaces can be used as a seed for the growth of the active layer (or stack of active layers). The nature of the seed layer 5 is chosen to have sufficient chemical affinity with all the components of the active layer that will be formed on the structure 10. The seed layer 5 is, therefore, suitable for fixing these elements and preventing the migration thereof during the formation of an active layer. In other words, the seed layer 5, because of its nature and its arrangement, limits the transport of material, typically the diffusion of atoms, from the surface of the seed layer 5 to the surface of the islands 4 or the active layer 6 that is formed on these islands.

For example, when the structure 10, and, in particular, the islands 4, is/are intended to receive an active layer comprising a III-V material, the seed layer 5 is preferably made of AlN. When formed by deposition directly on the dielectric layer 3, the seed layer 5 can be polycrystalline. Thus, in one exemplary implementation, the seed layer 5 can be made of polycrystalline AlN.

As a matter of fact, the applicant, during her extensive experiments, could observe that certain elements of column III and column V (and, in particular, indium) were particularly unreactive with the dielectric of the dielectric layer 3 and, therefore, could not be fixed thereto. However, they can all be easily fixed on an AlN seed layer 5.

The thickness of the seed layer 5 is not particularly decisive, as only the nature of its exposed surface is exploited within the scope of the present disclosure. As such, the seed layer can be composed of a plurality of layers stacked on top of each other, and only the layer with a surface exposed to the environment requires a chemical affinity with the components of the active layer. In practice, this thickness will be sufficient to perfectly cover the dielectric layer 3 between the islands 4, with a thickness remaining less than or equal to that of the islands 4 in order to maintain the exposed surfaces thereof and promote the subsequent formation of the active layer. For example, the seed layer 5 may have a thickness between a few nm and a few hundred nm.

Figure 2A:
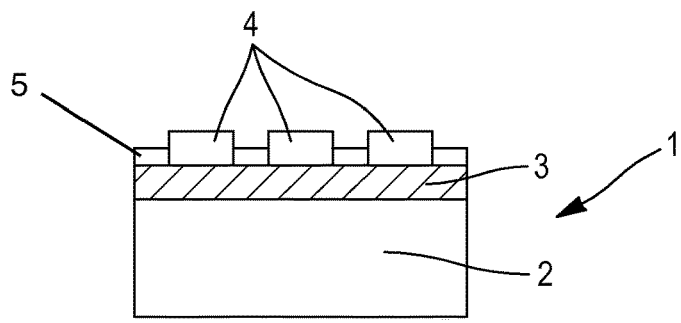
FIG. 2 shows a method for making a semiconductor device using a structure according to the disclosure.
Figure 2B:
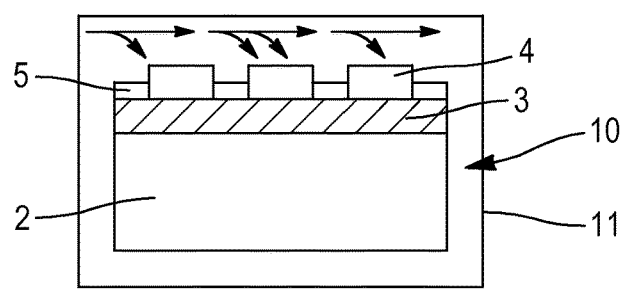
Figure 2C:
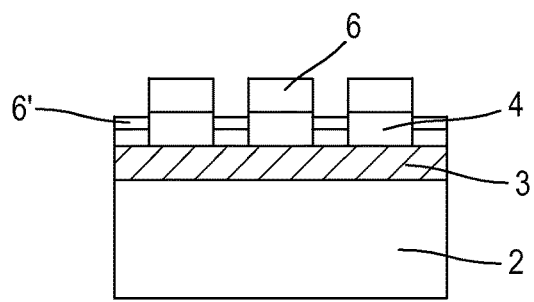

FIGS. 2a-2c illustrate a method for making a semiconductor device that takes advantage of the structure 10 just described.

In a first step shown in FIG. 2a, a structure 10 in accordance with the disclosure is provided. The structure 10 can be located in the chamber 11 of a conventional growth equipment. As is well known per se, the chamber is traversed by flows of precursor gases, transporting the species that make up the active layer, and heated. As shown schematically in FIG. 2b, the species included in the precursor gases circulating in the chamber 11 react with the exposed surfaces of the structure 10. On the exposed surfaces of the single-crystal semiconductor islands 4, a single-crystal active layer 6 is gradually formed by epitaxy. The good chemical affinity between the seed layer 5 and all the species constituting the active layer 6 also leads to the formation of a residue layer 6' between the islands 4, on the seed layer 5. This prevents some species from migrating and settling on the edges of the exposed surface of the islands as is the case in the absence of seed layer 5.

Upon completion of this step, and as shown in FIG. 2c, a structure 10 with an active semi-conductive and single-crystal layer 6 is obtained on the surface of the islands 4, which has an even thickness. For example, an active layer 6 may have a uniformity similar to that of the island on which it was formed.

Between the islands 4, on the seed layer 5, a residue layer 6', which can be polycrystalline, has formed. This residue layer 6' is not particularly useful and can be removed, by conventional steps of masking the useful active layer 6 with a photosensitive resin, photolithographic exposure, and dry or wet etching of the residue layer 6'.

The active layer(s) 6 on the structure 10 can undergo additional treatments, well known per se, such as the formation of additional layers, the formation of electrical contacts, the transfer to a final substrate in order to complete the realization of the semiconductor device and make it functional.

Figure 3A:
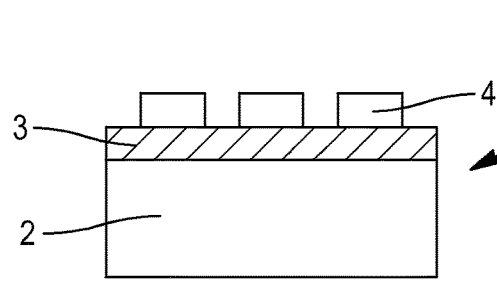
FIG. 3 shows the steps of a method for making a structure according to the disclosure according to a first embodiment.
Figure 3B:
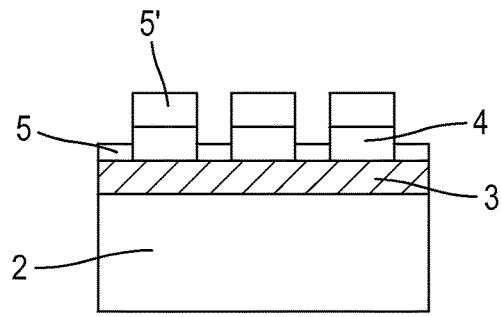
Figure 3C:
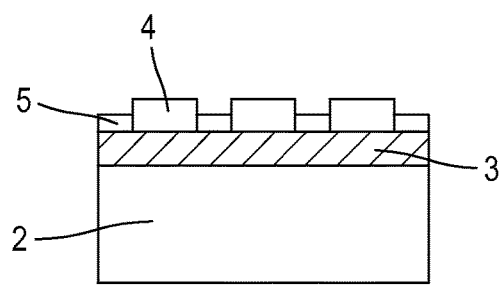

FIGS. 3a-3c illustrate the steps involved in the realization of a structure 10 in conformity with the disclosure according to a first embodiment.

In a first step shown in FIG. 3a, a substrate 1 is provided comprising a carrier 2, which has a main face, a dielectric layer 3 over the entire main face of the carrier 2 and a plurality of single-crystal semiconductor islands 4 located directly on the dielectric layer 3.

The particular way this substrate 1 was obtained is not particularly relevant to the present disclosure, and one of the methods presented in the disclosure of the prior art may be chosen, for example.

In a second step in FIG. 3b, a seed layer 5, 5' is formed over the entire exposed surface of the substrate 1. A portion of the seed layer 5' is located on the islands 4, and a complementary portion of the seed layer 5 is located between the islands 4, directly on the dielectric layer 3.

In a third step, the portion of the seed layer 5' located on the islands 4 is removed to expose the surfaces thereof for subsequent deposition of an active layer 6 or a plurality of such layers.

This withdrawal step can be performed in many ways.

In a first approach, the substrate in FIG. 3b is subjected to a mechanical-chemical polishing step (CMP of the acronym "Chemical Mechanical Polishing") in order to selectively remove, by mechanical and chemical thinning, the portion of the seed layer 5' located on the islands 4 of the substrate surface.

Another approach is to remove by dry or wet etching the portion of the seed layer 5' located on the islands 4 after having previously and selectively masked with a protective layer the portion of the seed layer 5 located directly on the dielectric layer 3. This selective masking can be achieved by the traditional steps of full surface deposition of a resin, exposure of this resin through a photolithographic mask defining the areas of the resin to be removed, and chemical removal of the resin in these areas.

Upon completion of this step, as shown in FIG. 3c, a structure 10 in conformity with the disclosure is obtained, which includes a seed layer 5 only located between the islands 4, directly on the dielectric layer 3.

FIGS. 4a-4d illustrate the steps involved in the fabrication of a structure 10 in conformity with the disclosure according to a second embodiment.

Figure 4A:
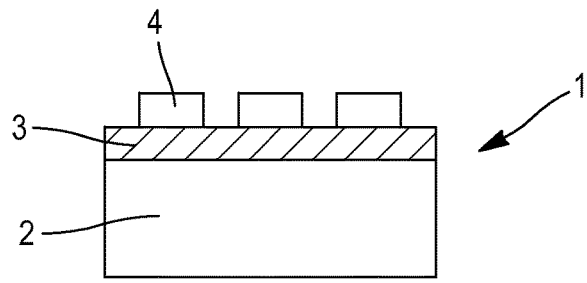
FIG. 4 shows the steps of a method for making a structure according to the disclosure according to a second embodiment.

The first step of providing the substrate 1, shown in FIG. 4a, is identical to that of the first embodiment and the same comments apply.

Figure 4B:
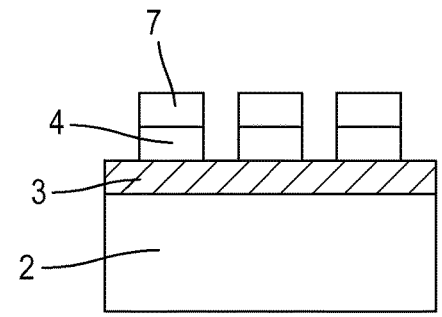

In a second step, shown in FIG. 4b, the exposed surface of the islands 4 is selectively masked with a protective layer 7, for example, a resin layer.

This selective masking step can be performed by a traditional full-surface resin deposition process, its exposure through a photolithographic mask to define areas corresponding to the islands 4 where the resin must be preserved, and the selective chemical removal of the resin outside these areas.

Figure 4C:
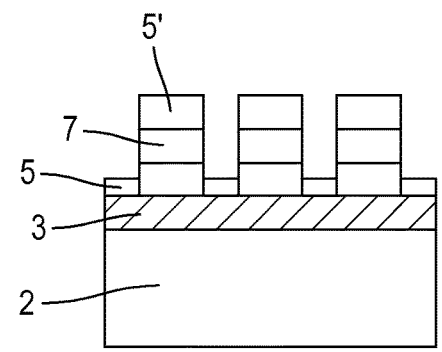

In a third step shown in FIG. 4c, the seed layer 5, 5' is formed over the entire exposed surface of the substrate 1. A portion of the seed layer 5' resides on the protective layer 7 masking the islands 4, and another portion of the seed layer 5 is located directly on the dielectric layer 3, between the islands 4.

Figure 4D:
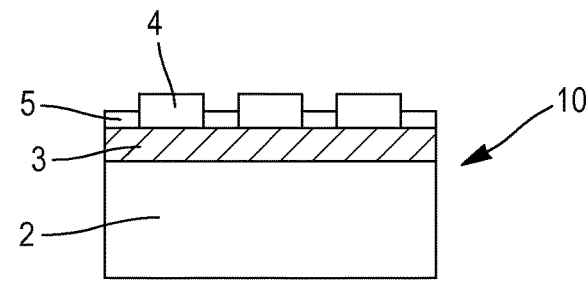

In a fourth step, the protective layer 7 and the portion of the seed layer 5' that resides on the protective layer 7 are removed. This can be achieved, for example, by providing a chemical etching solution that selectively removes the protective layer 7 and leads to the removal of the portion of the seed layer 5'. Upon completion of this step, a structure 10 in conformity with the disclosure, as shown in FIG. 4d, is obtained.

Of course, the disclosure is not limited to the example described and alternative embodiments can be provided without going beyond the scope of the disclosure, as defined by the following claims.

Thus, "single-crystal semiconductor" means a semiconductor material in a crystal form, wherein the crystal lattice is continuous, i.e., it does not have a grain boundary. However, the crystal may have defects, or imperfections such as punctual defects, dislocations, without losing its single-crystal character.

The structure 10, in addition to the substrate 1, the dielectric layer 3, the islands 4 and the seed layer 5, may include other layers, for example, located under the dielectric layer 3.

In addition, it is not necessary for the dielectric layer 3 to cover the entire main surface of the carrier 2. For example, it can be located only on the carrier 2, between the islands 4, or even on only a part of the surface of the carrier 2 between the islands 4. In all cases, and in accordance with the disclosure, the seed layer 5 is formed at least directly on the dielectric layer 3 likely to be exposed to its environment.

The invention claimed is:

1. A semiconductor substrate structure for producing at least one active layer made of a III-V material thereon, comprising:
    a carrier having a main face;
    a dielectric layer located over the main face of the carrier;
    a plurality of single-crystal semiconductor islands located directly on the dielectric layer, each of the plurality of single-crystal semiconductor islands having an exposed upper surface to be used as a seed surface for growth of the at least one active layer; and
    a polycrystalline AlN seed layer located between the single-crystal semiconductor islands, directly on a portion of the dielectric layer not covered by the single-crystal semiconductor islands such that the portion of the dielectric layer is not exposed to its environment, the polycrystalline AlN seed layer exhibiting a first thickness less than a second thickness of the plurality of single-crystal semiconductor islands.

2. The semiconductor substrate structure of claim 1, wherein the carrier comprises silicon or sapphire.

3. The semiconductor substrate structure of claim 2, wherein the dielectric layer comprises silicon oxide and/or silicon nitride.

4. The semiconductor substrate structure of claim 3, wherein the single-crystal semiconductor islands comprise a III-V material.

5. The semiconductor substrate structure of claim 4, wherein the single-crystal semiconductor islands comprise InGaN.

6. The semiconductor substrate structure of claim 1, wherein the dielectric layer comprises silicon oxide and/or silicon nitride.

7. The semiconductor substrate structure of claim 1, wherein the single-crystal semiconductor islands comprise a III-V material.

8. The semiconductor substrate structure of claim 7, wherein the single-crystal semiconductor islands comprise InGaN.

9. A method for producing a semiconductor substrate structure, comprising:
    providing a structure including a carrier having a main face, a dielectric layer located over the main face of the carrier, and a plurality of single-crystal semiconductor islands located directly on the dielectric layer, each of the plurality of single-crystal semiconductor islands having an exposed upper surface to be used as a seed surface for growth of an active layer of III-V material; and
    prior to growth on the exposed upper surface, forming a polycrystalline AlN seed layer between the single-crystal semiconductor islands and directly on a portion of the dielectric layer that is not covered by the single-crystal semiconductor islands such that the portion of the dielectric layer is not exposed to an external environment, the polycrystalline AlN seed layer exhibiting a first thickness less than a second thickness of the plurality of single-crystal semiconductor islands.

10. The method according to claim 9, wherein forming the polycrystalline AlN seed layer comprises depositing the polycrystalline AlN seed layer onto and between the single-crystal semiconductor islands, and then selectively removing portions of the polycrystalline AlN seed layer located on the single-crystal semiconductor islands.

11. The method of claim 10, wherein selectively removing the portions of the polycrystalline AlN seed layer located on the single-crystal semiconductor islands comprises subjecting the portions of the polycrystalline AlN seed layer located on the single-crystal semiconductor islands to a mechanical-chemical polishing process.

12. The method of claim 9, wherein forming the polycrystalline AlN seed layer comprises selectively forming a protective layer on the single-crystal semiconductor islands, depositing the polycrystalline AlN seed layer onto the protective layer and onto an exposed surface of the dielectric layer between the single-crystal semiconductor islands, and selectively removing the protective layer and portions of the polycrystalline AlN seed layer located on the single-crystal semiconductor islands.

13. The method of claim 12, wherein the protective layer comprises a photosensitive resin and selectively forming the protective layer on the single-crystal semiconductor islands comprises using a photolithography process to selectively form the protective layer on the single-crystal semiconductor islands.

14. The method of claim 12, wherein selectively removing the protective layer and the portions of the polycrystalline AlN seed layer located on the single-crystal semiconductor islands comprises chemically etching the protective layer and/or portions of the polycrystalline AlN seed layer located on the single-crystal semiconductor islands.

15. A method for manufacturing a semiconductor device, comprising:
    providing a substrate structure including:
        a carrier having a main face;
        a dielectric layer located over the main face of the carrier;
        a plurality of single-crystal semiconductor islands located directly on the dielectric layer, each of the plurality of single-crystal semiconductor islands having an exposed upper surface to be used as a seed surface for growth of at least one active layer; and
        a polycrystalline AlN seed layer located between the single-crystal semiconductor islands, directly on a portion of the dielectric layer not covered by the single-crystal semiconductor islands such that the portion of the dielectric layer is not exposed to its environment, the polycrystalline AlN seed layer exhibiting a first thickness less than a second thickness of the plurality of single-crystal semiconductor islands; and
    forming the at least one active layer of a III-V material on the single-crystal semiconductor islands.

16. The semiconductor substrate structure of claim 1, wherein the polycrystalline AlN seed layer comprises a plurality of polycrystalline AlN layers stacked on top of one another.

17. The semiconductor substrate structure of claim 1, wherein the polycrystalline AlN seed layer is selected to have sufficient chemical affinity with constituents of the at least one active layer to be formed such that the polycrystalline AlN seed layer prevents the constituents from settling on edges of the exposed upper surface of the plurality of single-crystal semiconductor islands.

18. The method of claim 9, further comprising exposing the structure to precursor gases to form the active layer of III-V material on the exposed upper surface of the plurality of single-crystal semiconductor islands.

19. The method of claim 18, wherein exposing the structure to precursor gases comprises forming a residue layer on the polycrystalline AlN seed layer.

20. The method of claim 18, wherein exposing the structure to precursor gases comprises preventing chemical species from the precursor gases from migrating and settling on edges of the exposed upper surface of the plurality of single-crystal semiconductor islands.

* * * * *